United States Patent [19]
Kenji

[11] Patent Number: 4,568,840
[45] Date of Patent: Feb. 4, 1986

[54] VARIABLE RESISTANCE CIRCUIT
[75] Inventor: Yokoyama Kenji, Hamamatsu, Japan
[73] Assignee: Nippon Gakki Seizo Kabushiki Kaisha, Hamamatsu, Japan
[21] Appl. No.: 549,976
[22] Filed: Nov. 8, 1983
[30] Foreign Application Priority Data
Dec. 25, 1982 [JP] Japan ................................ 57-228909
[51] Int. Cl.⁴ ......................... H03L 5/00; H03K 5/22
[52] U.S. Cl. .................................. 307/264; 307/494; 330/257; 330/288
[58] Field of Search ............... 307/490, 493, 494, 264, 307/540; 330/284, 288, 254, 282, 257

[56] References Cited
U.S. PATENT DOCUMENTS

| 3,739,195 | 6/1973 | Fidi et al. | 307/490 |
|---|---|---|---|
| 3,891,937 | 6/1975 | Bockelmann et al. | 330/254 |
| 4,039,981 | 8/1977 | Ohashi et al. | 307/264 |
| 4,066,914 | 1/1978 | Gundry | 307/264 |
| 4,152,667 | 5/1979 | Visser | 330/282 |
| 4,242,650 | 12/1980 | Cordell | 330/282 |
| 4,288,707 | 9/1981 | Katakura | 330/257 |
| 4,513,242 | 4/1985 | Yokogawa | 307/264 |
| 4,513,252 | 4/1985 | Sano | 330/257 |

FOREIGN PATENT DOCUMENTS 0085607 5/1983 Japan ................................ 307/540

Primary Examiner—Stanley D. Miller
Assistant Examiner—Timothy P. Callahan
Attorney, Agent, or Firm—Spensley Horn Jubas & Lubitz

[57] ABSTRACT

A variable resistance circuit comprises first and second transistor pairs, first and second load circuits connected to respective collector sides of the first and second transistor pairs, and first and second constant current sources connected to respective common connected emitters of the first and second transistor pairs. Each of the load circuits supplies collectors of each transistor pair with currents having same current values with each other. Each of the constant current sources supplies the common connected emitters of each transistor pairs with a constant current. Respective base and collector of one transistors of the first and second transistor pairs are connected to each other and connected to first and second terminals, respectively. Bases of the other transistors of the first and second transistor pairs are connected to the second and first terminals, respectively. There is obtained resistance characteristics between the first and second terminals, and a resistance value between the first and second terminals is varied in accordance with constant current values of the first and second constant current sources.

11 Claims, 8 Drawing Figures

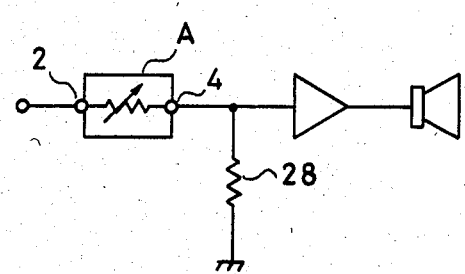
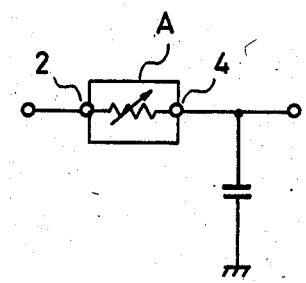
FIG. 6　　　　FIG. 7
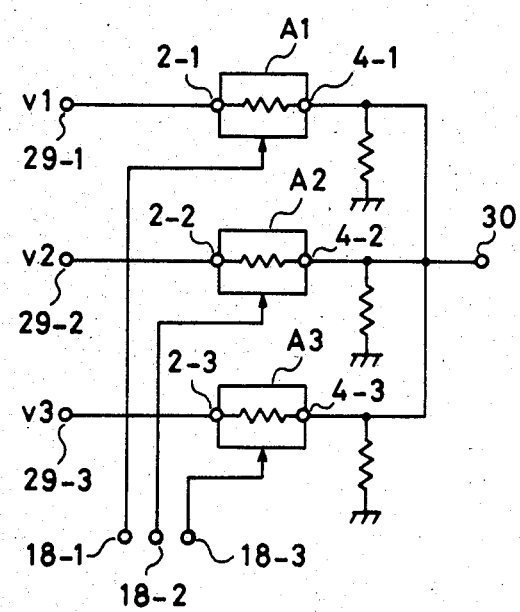
FIG. 8

VARIABLE RESISTANCE CIRCUIT

BACKGROUND OF THE INVENTION

1. Field of the invention

The present invention relates to a variable resistance circuit, and, more particularly, to a variable resistance circuit the resistance value of which is varied electronically.

2. Description of the prior art

Various variable resistance devices have been known heretofore to obtain a adjustable resistance value across two terminals thereof. One known device is a variable resistor whose resistance value is mechanically varied in response to the manipulation of the slider contact. Such variable resistor, however, has disadvantages in stablity and reliability in its operation due to the abrasion of and the adhesion of dust to the slider contact. Since the resistance value is mechanically varied in itself, it is difficult to electronically vary the resistance value. Further, such variable resistor inserted in a signal path degrades a signal-to-noise ratio thereof. Another known devices are variable resistance circuits such as a voltage controlled amplifier (hereinafter called VCA) and a circuit using variable characteristics of conductiveness of semiconductor devices such as field effect transistor (hereinafter called FET). However, the VCA has the restriction in its use, that is, the VCA cannot be used as a variable resistance device in a floating condition across power supplies. On the other hand, in the circuit using FET, the allowable input voltage is low due to the characteristics of FET device in itself, and the circuit has a drawback to develop a distortion due to the non-linearity characteristics of FET. In addition to this, the circuit is normally the one that the resistance value against the ground is varied, and accordingly has such restriction in its use as the VCA.

SUMMARY OF THE INVENTION

It is an object of this invention to provide an improved variable resistance circuit which is stable and reliable in its operation.

Another object of this invention is to provide a variable resistance circuit the resistance value of which is electronically varied.

A further object of this invention is to provide a variable resistance circuit which has low distortion characteristics and an improved signal-to noise ratio.

Yet another object of this invention is to provide a variable resistance circuit which can be used in a floating condition across power supplies.

A still further object of this invention is to provide a variable resistance circuit which allowable input voltage is great.

An additional object of this invention is to provide a variable resistance circuit which can be easily constructed in an integrated circuit.

A variable resistance circuit embodying this invention is comprised of first and second transistor pairs, first and second load circuits connected to respective collector sides of the first and second transistor pairs, each of the load circuits supplying collectors of each transistor pair with currents having same current values with each other, first and second constant current sources connected to respective common connected emitters of the first and second transistor pairs, each of the constant current sources supplying the common connected emitters of each transistor pair with a constant current, a first terminal connected to base and collector of one transistor of the first transistor pair and to a base of one transistor of the second transistor pair, and a second terminal connected to base and collector of the other transistor of the second transistor pair and to a base of the other transistor of the first transistor pair, between the first and second terminals there being obtained a resistance, the value of which is varied in accordance with constant current values of the first and second constant current sources.

BRIEF DESCRIPTION OF THE DRAWINGS

FIG. 6 is a schematic circuit diagram of the sound reproducing apparatus wherein the variable resistance circuit of this invention is used as the volume controlling device;

FIG. 7 is a schematic circuit diagram of the low-pass filter circuit with variable characteristics wherein the variable resistance circuit of this invention is used as the characteristics varying device; and FIG. 8 is a schematic circuit diagram of the analog switch circuit wherein the variable resistance circuits of this invention are used as the switching elements.

DETAILED DESCRIPTION OF THE PREFERRED EMBODIMENTS

Figures 1, 3:
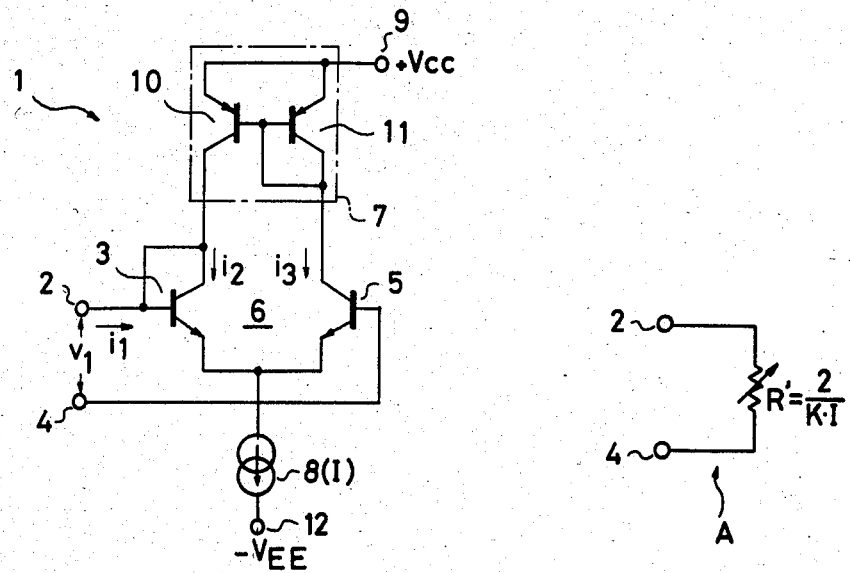
FIG. 1 is a schematic circuit diagram showing a principle of the variable resistance circuit according to this invention.
FIG. 3 is an equivalent circuit diagram of the variable resistance circuit shown in FIG. 2.

Prior to description of embodiments of this invention a principle of this invention will be described referring to a basic circuit diagram 1 shown in FIG. 1. The circuit 1 comprises a transistor pair 6 having NPN transistors 3 and 5 whose emitters are commonly connected to each other, a current mirror circuit 7 which supplies collectors of the transistors 3 and 5 with currents having same current values, and a constant current source 8 which supplies the common connected emitters of the transistors 3 and 5 with a constant current. A base and a collector of the transistor 3 are connected to a first terminal 2, and a base of the transistor 5 is connected to a second terminal 4. The current mirror circuit 7 comprises a PNP transistor 10 having a collector connected to the collector of the transistor 3, an emitter connected to a positive power supply terminal 9 to which a positive power voltage $+V_{CC}$ is applied, and a base, and an NPN transistor 11 having a collector connected to the collector of the transistor 5, an emitter connected to the positive power supply terminal, and a base connected to the base of the transistor 3 and to the collector of the transistor 5. Another end of the constant current source 8 is connected to a negative power supply terminal 12 to which a negative power voltage $-V_{EE}$ is applied.

The operation of the circuit 1 shown in FIG. 1 will be described hereinafter. Assuming that a voltage applied across the first and second terminals 2 and 4 is v1, a current flowing into the base of the transistor 3 is i1, collector currents of the transistors 3 and 5 are i2 and i3, respectively, and the constant current of the constant current source 8 is I, and that base currents of the transistors 3 and 5 is negligibly small, there exist following relationships among i1, i2 and i3 considering the function of the current mirror circuit 7.

$$i2 - i1 = i3 \tag{1}$$

Between i2, i3 and I, there exist relationships represented as follows:

$$i2 + i3 = I \tag{2}$$

Based on the characteristics of the P-N junctions of the transistors 3 and 5, a following equation is obtained among i2, i3 and v1.

$$i2 = i3 \cdot \exp(K \cdot v1) \tag{3}$$

where
K = q/(k·T)
k = Boltzmann constant
q = elementary charge
T = absolute temperature
Substituting equation (2) into equation (3), $$i2 = (I - i2) \cdot \exp(K \cdot v1)$$

Accordingly, $$i2 = (I \cdot \exp(K \cdot v1))/(1 + \exp(K \cdot v1)) \tag{4}$$

On the other hand, from the equations (1) and (2), the current i1 is represented as follows:

$$i1 = 2 \cdot i2 - I \tag{5}$$

Therefore, substituting equation (4) into equation (5), $$i1 = I(\exp(K \cdot v1) - 1)/(1 + \exp(K \cdot v1)) \tag{6}$$

Assuming that the absolute value of (K·v1) is nearly equal to zero, the value exp(K·v1) is approximate to the value (1+K·v1) based on the Taylor's theorem. Therefore, from the equation (6), the current i1 is represented as follows:

$$i1 \approx I \cdot (K \cdot v1)/(2 + K \cdot v1) \tag{7}$$
$$= v1 \cdot (K \cdot I)/2$$

As will be evident from equation (7), in the circuit 1 of FIG. 1, the current i1 is proportional to the voltage v1 under the condition that the voltage v1 is small. In other words, the circuit 1 is considered as the resistance device or circuit which has the resistance value R' of 2/(K·I) across the terminals 2 and 4.

Incidentally, in order to establish the resistance circuit in a floating condition across the two terminals, it is necessary for the circuit to satisfy the conditions that the amount of the current flowing into one terminal thereof is equal to the amount of the current derived from the other terminal, in view of the Kirchhoff's law.

Figure 2:
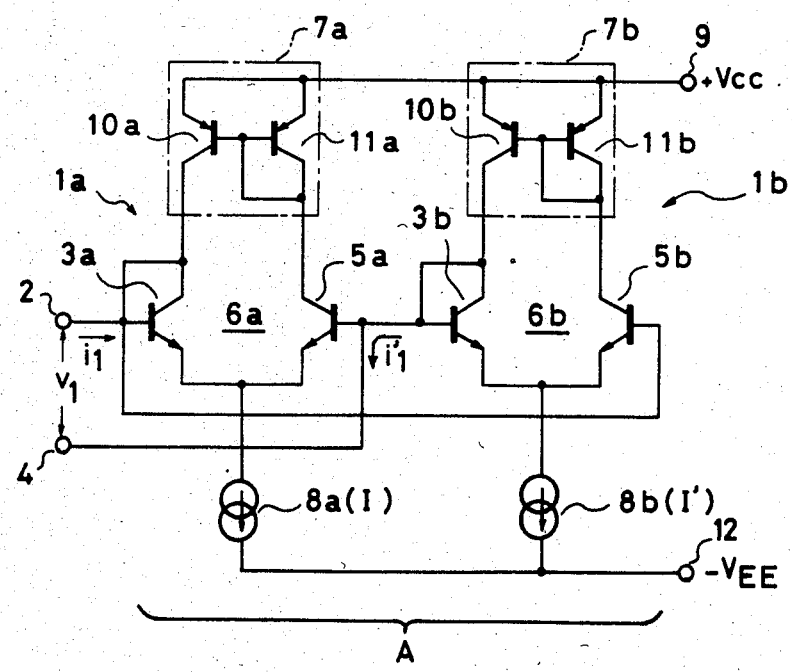
FIG. 2 is a circuit diagram of a first embodiment of the variable resistance circuit according to this invention.

FIG. 2 shows the practical variable resistance circuit A of the first embodiment of this invention constructed considering the above principles. In the circuit A, circuits 1a and 1b are constructed in the same manner as the circuit 1 shown in FIG. 1, and the corresponding elements in the circuits 1a and 1b are designated by the same numerals with suffix of a and b, respectively, and the circuits 1a and 1b are connected to the terminals 2 and 4 in a opposite manner to each other as shown in FIG. 2.

In the circuit A configured as shown in FIG. 2, assuming that a voltage applied across the first and second terminals 2 and 4 is v1, currents flowing into the terminal 2 and derived from the terminal 4 are i1 and i'1, respectively, and currents of the constant current sources 8a and 8b are I and I', respectively, the currents i1 and i'1 are repesented by the following equations as will be evident from the above analysis as to the circuit of FIG. 1.

$$\left. \begin{array}{l} i1 = v1 \cdot (K \cdot I)/2 \\ i'1 = v1 \cdot (K \cdot I')/2 \end{array} \right] \tag{8}$$

Accordingly, if the current I' is set equal to the current I, then the current i'1 is equal to the current i1 and the circuit A is considered as a resistance circuit in a floating condition which has a resistance value R' of 2/(K·I) across the terminals 2 and 4. By using variable constant current sources whose constant current values can be varied as the constant current sources 8a and 8b, the circuit A is considered as a variable resistance circuit the resistance value of which is varied in response to the adjustment of the constant current values of the constant current sources 8a and 8b, and the equivalent circuit of the circuit A is represented as shown in FIG. 3.

In the circuit A, the emitter sides of the transistors 3a, 5a, 3b and 5b are constructed in high impedance due to the constant current sources 8a and 8b, and the collector sides thereof are also constructed in high impedance due to the current mirror circuits 7a and 7b, and accordingly the allowable operating ranges of the transistors 3a, 5a, 3b and 5b are those between the positive and negative power supply voltages $+V_{CC}$ and $-V_{EE}$ Therefore, the circuit A has an extremely large dynamic range.

Figure 4:
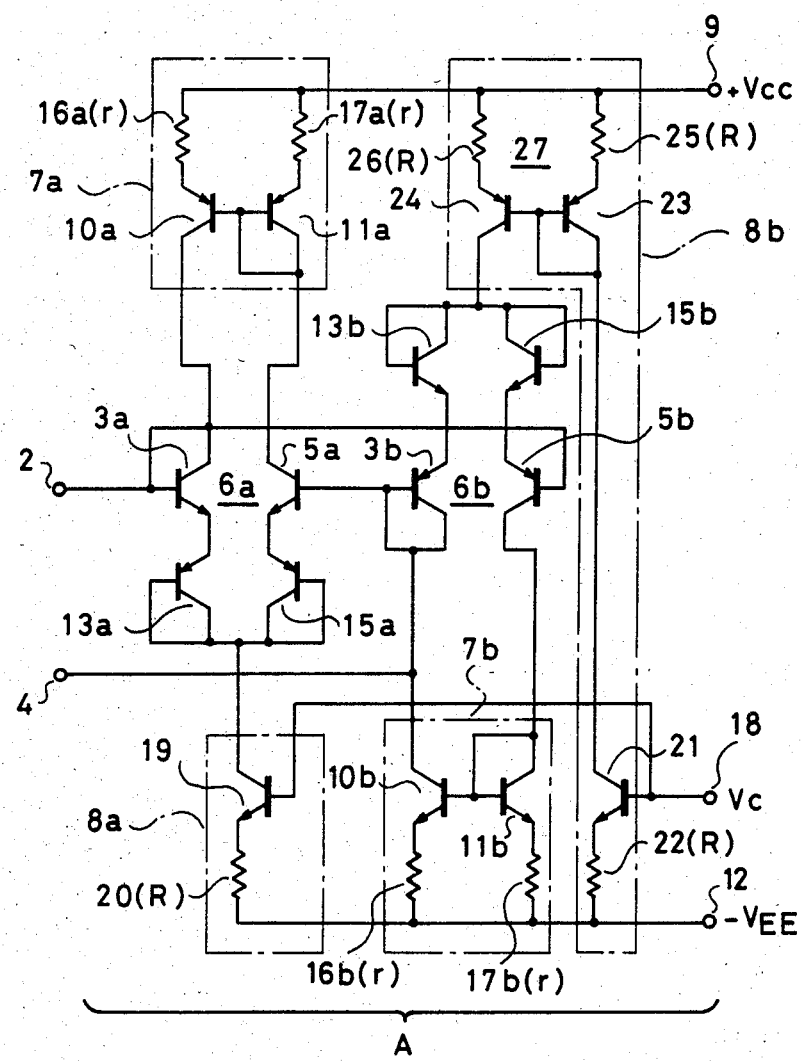
FIG. 4 is a circuit diagram of a second embodiment of the variable resistance circuit according to this invention.

FIG. 4 shows a variable resistance circuit according to another embodiment of this invention in which first and second transistor pairs are constructed by transistor pairs having opposite polarities to each other so as to obtain low distortion characteristics. In the circuit A of FIG. 4, first and second transistor pairs 6a and 6b are comprised of NPN transistors 3a and 5a, and PNP transistors 3b and 5b, respectively. To the emitters of the respective transistors 3a, 5a, 3b and 5b are in series connected PNP transistors 13a and 15a and NPN transistors 13b and 15b, respectively. The respective bases and collectors of the transistors 13a, 15a, 13b and 15b are connected to each other so as to function as a diode and to compensate or equalize the $V_{BE} - I_C$ characteristics of the transistors 3a, 5a, 3b and 5b. In a current mirror circuit 7a, resistors 16a and 17a (value r) are connected in series to emitters of PNP transistors 10a and 11a. A current mirror circuit 7b as a load of the transistors 3b and 5b are connected between the collectors of the transistors 3b and 5b and a negative power supply terminal 12, and comprises NPN transistors 10b and 11b and resistors 16b and 17b (value r) connected in series to the emitters of the transistors 10b and 11b. A constant current source 8a is comprised of an NPN transistor 19 having a base connected to a terminal 18 to which a control voltage Vc is applied, an emitter connected to the negative power supply terminal 12 via a resistor 20 (value R), and a collector connected to the bases and collectors of the transistor 13a and 15a. Through the transistors 13a and 15a flows a current the value of which is in accordance with the control voltage Vc. A constant current source 8b comprises an NPN transistor 21 having a base connected to the terminal 18, an emitter connected to the negative power supply terminal 12 via a resistor 22 (value R), and a collector connected to a current mirror circuit 27. The current mirror circuit 27 is comprised of PNP transistors 23 and 24 and resistors 25 and 26 (value R) connected between a positive power supply terminal 9 and the emitters of the transistors 23 and 24, respectively. Through the transistors 23 and 24 flows currents the values of which is in accordance with the control voltage Vc at the terminal 18.

In the circuit A of FIG. 4, the transistor pairs 6a and 6b are constructed by the transistors having opposite polarities to each other, so that base currents flowing into the bases of the transistors 3a and 5a are much the same in amount as those derived from the bases of the transistors 3b and 5b. According to this, an insufficiency in the operation characteristics or an error due to the base current is prevented from developing and is resolved. The $V_{BE}-I_C$ characteristics of the transistors 3a, 5a, 3b and 5b are much the same with each other due to the connection of the transistors 13a, 15a, 13b and 15b, so that the development of distortion due to the differences between them in the characteristics is prevented Furthermore, since a portion of the transistor pair 6a, the current mirror circuit 7a, and the constant current source 8a, and a portion of the transistor pair 6b, the current mirror circuit 7b, and the constant current source 8b operate symmetrically to each other against an alternate signal applied across the terminals 2 and 4, the generation of even harmonic type distortion is also prevented.

Figure 5:
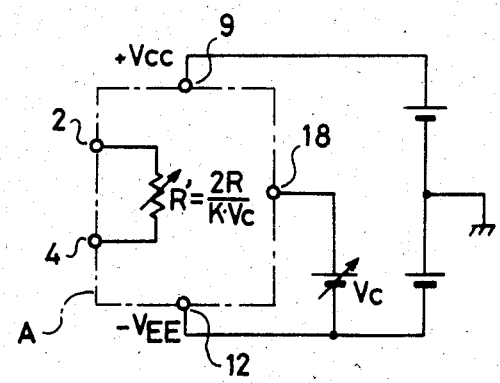
FIG. 5 is an equivalent circuit diagram of the variable resistance circuit shown in FIG. 4.

Incidentally, the common emitter currents of the transistor pairs 6a and 6b are determined by the control voltage Vc applied to the terminal 18 and the resistance value R of the resistors 20, 22, 25 and 26, and the value I of the common emitter currents is represented by (Vc/R), where base currents of the transistors 19, 21, 23 and 24 are negligibly small. It should be noted here that the collector currents of the transistors 19, 21, 23 and 24 are coincident with each other if the base-emitter voltage $V_{BE}$ thereof are same with each other. And, the resistance value R' between the terminals 2 and 4 is represented by 2/(K·I) as will be evident from the analysis with respect to the above embodiment. Accordingly, the resistance value R' is also represented by 2R/(K·Vc), so that it should be noted that the resistance value R' is inversely proportional to the control voltage Vc. FIG. 5 shows an eqivalent circuit of the circuit A in FIG. 4 the resistance value R' of which is represented by 2R/(K·Vc).

Examples of the applications of the variable resistance circuit are shown in FIGS. 6 through 9. FIG. 6 shows application example to a sound volume controlling circuit in a sound reproducing apparatus. In this circuitry, subject to the condition that a resistance value of a resistor 28 connected between the terminal 4 and the ground is set at a small value, a residual noise are reduced even when the resistance value between the terminals 2 and 4 is increased so as to suppress the sound volume, so that the signal-to-noise ratio is improved.

FIG. 7 shows a low-pass filter circuit with variable characteristics having the variable resistance circuit A which is used as the characteristics varying resistor device.

FIG. 8 shows application example to a switching elements in an analog switch circuit. The switch circuit selects the signals V1, V2 and V3 applied to respective input terminals 29-1, 29-2 and 29-3 in response to control signals applied to control terminals 18-1, 18-2 and 18-3 and outputs the selected signal(s) at an output terminal 30. Since resistance values of variable resistance circuits A1, A2 and A3 are same values as impedances of the P-N junction inversely biased when constant current sources therein are controlled so that the constant currents flowing therethrough are zero, there are obtained high ratios of impedances of the circuits A1, A2 and A3 when the circuits A1, A2 and A3 are controlled to open to those when the circuits A1, A2 and A3 are controlled to close. In addition to this, by using large power supply voltages, large allowable input voltage is obtained comparing with the prior art analog switch circuit comprising CMOS gates the allowable input voltage of which is about 12 [Volts]. In the FIG. 8, reference numerals 2-1 to 2-3 and 4-1 to 4-3 designate input and output terminals of the circuits A1 to A3, respectively.

What is claimed is:

1. A variable resistance circuit comprising:
    first and second terminals between which resistance characteristics are obtained;
    positive and negative power supplies;
    a first transistor pair being comprised of first and second transistors, said first transistor having a base and collector connected to said first terminal and an emitter, and said second transistor having a base connected to said second terminal, an emitter connected to the emitter of said first transistor and a collector;
    a second transistor pair being comprised of third and fourth transistors, said third transistor having a base and collector connected to said second terminal and an emitter, and said fourth transistor having a base connected to said first terminal, an emitter connected to the emitter of said third transistor and a collector;
    a first load circuit, coupled to one of said power supplies, for supplying the collectors of said first and second transistors with currents of equal value;
    a second load circuit, coupled to one of said power supplies, for supplying the collectors of said third and fourth transistors with currents of equal value;
    a first constant current source, coupled to the power supply other than the one to which said first load circuit is coupled, for supplying the common connected emitters of said first and second transistors with a constant current; and
    a second constant current source, coupled to the power supply other than the one to which said second load circuit is coupled, for supplying the common connected emitters of said third and fourth transistors with a constant current;
    wherein a resistance value between said first and second terminals is varied in accordance with current values of said first and second constant current sources.

2. A variable resistance circuit according to claim 1, wherein
    said current values of the first and second constant sources are set to be equal.

3. A variable resistance circuit according to claim 2, further including
first to fourth compensating transistors whose emitters are connected to the emitters of the first to fourth transistors, respectively, wherein the base and collector of each compensating transistor is connected together in a diode configuration.

4. A variable resistance circuit according to claim 2, wherein
said first to fourth transistors have the same conductivity type.

5. A variable resistance circuit according to claim 4, wherein
said first to fourth transistors are NPN transistors,
said first and second constant current sources are connected between the negative power supply and the common connected emitters of said first and second transistor pairs respectively, and
said first and second load circuits are connected between the positive power supply and the collectors of said first transistor pair and between the positive power supply and the collectors of said second transistor pair, respectively.

6. A variable resistance circuit according to claim 5, wherein
said first and second load circuits are comprised of current mirror circuits.

7. A variable resistance circuit according to claim 2 wherein,
said first and second transistors have the same conductivity type, and
said third and fourth transistors have opposite conductivity types to that of said first and second transistors.

8. A variable resistance circuit according to claim 7, wherein
said first and second transistors are NPN transistors, and
said third and fourth transistors are PNP transistors, and wherein
said first load circuit is connected between the positive power supply and the collectors of said first transistor pair,
said first constant current source is connected between the negative power supply and the common connected emitters of said first transistor pair,
said second load circuit is connected between the negative power supply and the collectors of said second transistor pair, and
said second constant current source is connected between the positive power supply and the common connected emitters of said second transistor pair.

9. A variable resistance circuit according to claim 8, wherein
said first and second load circuits are comprised of current mirror circuits.

10. A variable resistance circuit according to claim 9, wherein
said second constant current source comprises a current mirror circuit, one current path of which is connected between the positive power supply and the common connected emitters of said second transistor pair, and a constant current source circuit for supplying a constant current through the other current path of said current mirror circuit.

11. A variable resistance circuit according to claim 10, wherein
each of said first and second constant current sources comprises a transistor having a collector-emitter path through which the constant current flows, and a base to which a control volatge is applied, and wherein
each constant current value of said first and second constant current sources is determined by a value of said control voltage, so that the resistance value between the first and second terminals is determined by the value of said control voltage.

* * * * *